(12) United States Patent
Tsai et al.

(10) Patent No.: US 12,725,545 B2
(45) Date of Patent: Sep. 1, 2026

(54) METHOD FOR DISPLAY IMAGE AND ELECTRONIC DEVICE

(71) Applicant: InnoLux Corporation, Miao-Li County (TW)

(72) Inventors: Wei-Cheng Tsai, Miao-Li County (TW); Hsin-Yi Huang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 19/207,573

(22) Filed: May 14, 2025

(65) Prior Publication Data

US 2025/0384799 A1 Dec. 18, 2025

(30) Foreign Application Priority Data

Jun. 17, 2024 (CN) ........................ 202410775983.X

(51) Int. Cl.
*G09G 3/00* (2006.01)
*G01R 19/165* (2006.01)

(52) U.S. Cl.
CPC ......... *G09G 3/006* (2013.01); *G01R 19/1659* (2013.01); *G09G 2330/021* (2013.01)

(58) Field of Classification Search
CPC ............. G09G 3/006; G09G 2330/021; G01R 19/1659
USPC .......................................................... 345/212
See application file for complete search history.

(56) References Cited

U.S. PATENT DOCUMENTS

2020/0219439 A1* 7/2020 Wu ...................... G09G 3/3208
2024/0177679 A1* 5/2024 Park ..................... G09G 3/3233

FOREIGN PATENT DOCUMENTS

CN 102053412 B 4/2013
CN 103794183 B 6/2016

* cited by examiner

*Primary Examiner* — Mark Edwards
(74) *Attorney, Agent, or Firm* — McClure, Qualey & Rodack, LLP

(57) ABSTRACT

A method for displaying an image includes the following steps. A display panel and a control circuit are provided, wherein the control circuit is electrically connected to the display panel. During a detection period, the control circuit provides a plurality of gate testing voltages to the display panel, wherein the plurality of gate testing voltages include a maximum testing voltage, an operation voltage and a failure testing voltage, the maximum testing voltage is higher than the operation voltage, the operation voltage is higher than the failure testing voltage, and the time point at which the maximum testing voltage appears is earlier than the time point at which the failure testing voltage appears. During a working period, the control circuit outputs at least one image signal to the display panel according to the operation voltage.

20 Claims, 3 Drawing Sheets

METHOD FOR DISPLAY IMAGE AND ELECTRONIC DEVICE

CROSS REFERENCE TO RELATED APPLICATIONS

This application claims priority of China Patent Application No. 202410775983.X, filed on Jun. 17, 2024, the entirety of which is incorporated by reference herein.

BACKGROUND OF THE DISCLOSURE

Field of the Disclosure

The disclosure relates to a method for displaying an image and an electronic device, and in particular, to a method for displaying an image and an electronic device with consistent optical quality.

Description of the Related Art

In a conventional display device, the driving voltage is fixed and not optimized, resulting in unnecessary power consumption. In addition, if the driving voltage is dynamically modulated, the optical quality will be inconsistent and the display quality of the display device will be reduced. Therefore, a new design is needed to solve the problem described above.

BRIEF SUMMARY OF THE DISCLOSURE

An embodiment of the disclosure provides a method for displaying an image, which includes the following steps. A display panel and a control circuit are provided, wherein the control circuit is electrically connected to the display panel. During a detection period, the control circuit is used to provide a plurality of gate testing voltages to the display panel, wherein the gate testing voltages include a maximum testing voltage, an operation voltage and a failure testing voltage. The maximum testing voltage is higher than the operation voltage. The operation voltage is higher than the failure testing voltage. The time point at which the maximum testing voltage appears is earlier than the time point at which the failure testing voltage appears. During a working period, the control circuit is used to output at least one image signal to the display panel according to the operation voltage.

An embodiment of the disclosure provides an electronic device, which includes. a display panel and a control circuit. The control circuit is electrically connected to the display panel. An operation period of the display panel includes a detection period and a working period. During the detection period, the control circuit is configured to provide a plurality of gate testing voltages to the display panel, wherein the gate testing voltages comprise a maximum testing voltage, an operation voltage and a failure testing voltage. The maximum testing voltage is higher than the operation voltage. The operation voltage is higher than the failure testing voltage. The time point at which the maximum testing voltage appears is earlier than the time point at which the failure testing voltage appears. During the working period, the control circuit is configured to output at least one image signal to the display panel according to the operation voltage.

BRIEF DESCRIPTION OF THE DRAWINGS

The disclosure can be fully understood by reading the subsequent detailed description and examples with references made to the accompanying drawings, wherein.

DETAILED DESCRIPTION OF THE DISCLOSURE

Figure 1:
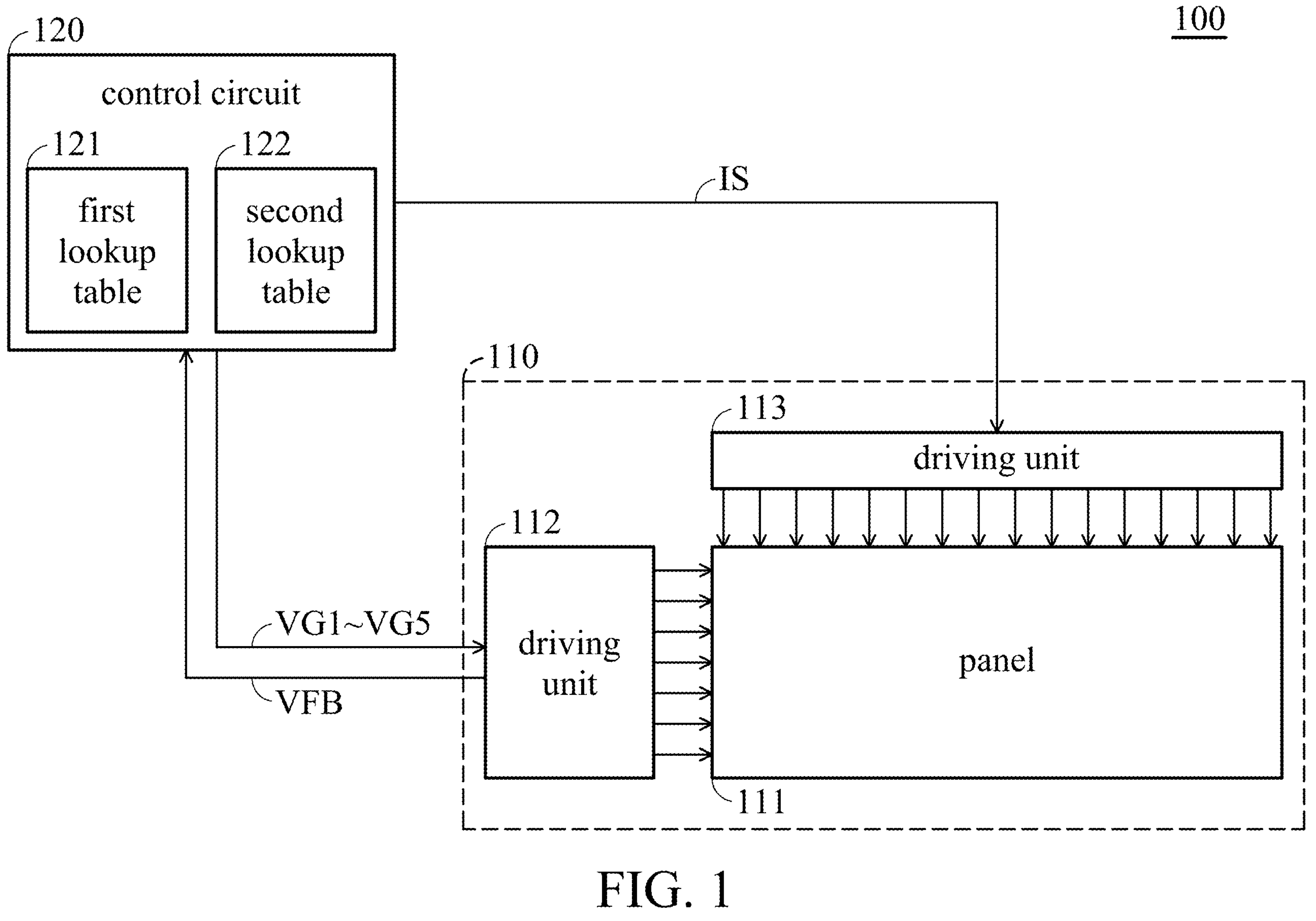
FIG. 1 is a schematic view of an electronic device according to an embodiment of the disclosure.

In order to make objects, features and advantages of the disclosure more obvious and easily understood, the embodiments are described below, and the detailed description is made in conjunction with the drawings. In order to help the reader to understand the drawings, the multiple drawings in the disclosure may depict a part of the entire device, and the specific components in the drawing are not drawn to scale.

The specification of the disclosure provides various embodiments to illustrate the technical features of the various embodiments of the disclosure. The configuration, quantity, and size of each component in the embodiments are for illustrative purposes, and are not intended to limit the disclosure. In addition, if the reference number of a component in the embodiments and the drawings appears repeatedly, it is for the purpose of simplifying the description, and does not mean to imply a relationship between different embodiments.

Furthermore, use of ordinal terms such as “first”, “second”, etc., in the specification and the claims to describe a claim element does not by itself connote and represent the claim element having any previous ordinal term, and does not represent the order of one claim element over another or the order of the manufacturing method, either. The ordinal terms are used as labels to distinguish one claim element having a certain name from another element having the same name.

In the disclosure, the technical features of the various embodiments may be replaced or combined with each other to complete other embodiments without being mutually exclusive.

In some embodiments of the disclosure, unless specifically defined, the term “coupled” or “electrically connected” may include any direct and indirect means of electrical connection.

In the text, the terms “substantially” or “approximately” usually means within 20%, or within 10%, or within 5%, or within 3%, or within 2%, or within 1%, or within 0.5% of a given value or range. The quantity given here is an approximate quantity. That is, without the specific description of “substantially” or “approximately”, the meaning of “substantially” or “approximately” may still be implied.

The “including” mentioned in the entire specification and claims is an open term, so it should be interpreted as “including or comprising but not limited to”.

Furthermore, “connected or “coupled” herein includes any direct and indirect connection means. Therefore, an element or layer is referred to as being “connected to” or “coupled to” another element or layer, the element or layer can be directly on, connected or coupled to another element or layer or intervening elements or layers may be present. When an element is referred to as being “directly connected to” or “directly coupled to” another element or layer, there are no intervening elements or layers present. If the text describes that a first device on a circuit is coupled to a second device, it indicates that the first device may be directly electrically connected to the second device. When the first device is directly electrically connected to the second device, the first device and the second device are connected through conductive lines or passive elements (such as resistors, capacitors, etc.), and no other electronic elements are connected between the first device and the second device.

In an embodiment, the electronic device may include a display device, a backlight device, an antenna device, a sensing device, a splicing device or a therapeutic diagnosis device, but the disclosure is not limited thereto. The electronic device may be a bendable or flexible electronic device. The display device may be a non-self-luminous type display device or a self-luminous type display device. The antenna device may be a liquid-crystal type antenna device or a non-liquid-crystal type antenna device, and the sensing device may be a sensing device that senses capacitance, light, heat or ultrasound, but the disclosure is not limited thereto. The electronic component may include a passive component and an active component, such as a capacitor, a resistor, an inductor, a diode, a transistor, etc. The diode may include a light-emitting diode or a photodiode. The light-emitting diode may include, for example, an organic light-emitting diode (OLED), a mini LED, a micro LED or a quantum dot LED, but the disclosure is not limited thereto. The splicing device may be, for example, a display splicing device or an antenna splicing device, but the disclosure is not limited thereto. It should be noted that the electronic device may be any arrangement and combination of the above devices, but the disclosure is not limited thereto. Hereinafter, the display device will be used as an electronic device to illustrate to the content of the disclosure, but the disclosure is not limited thereto.

Figure 2:
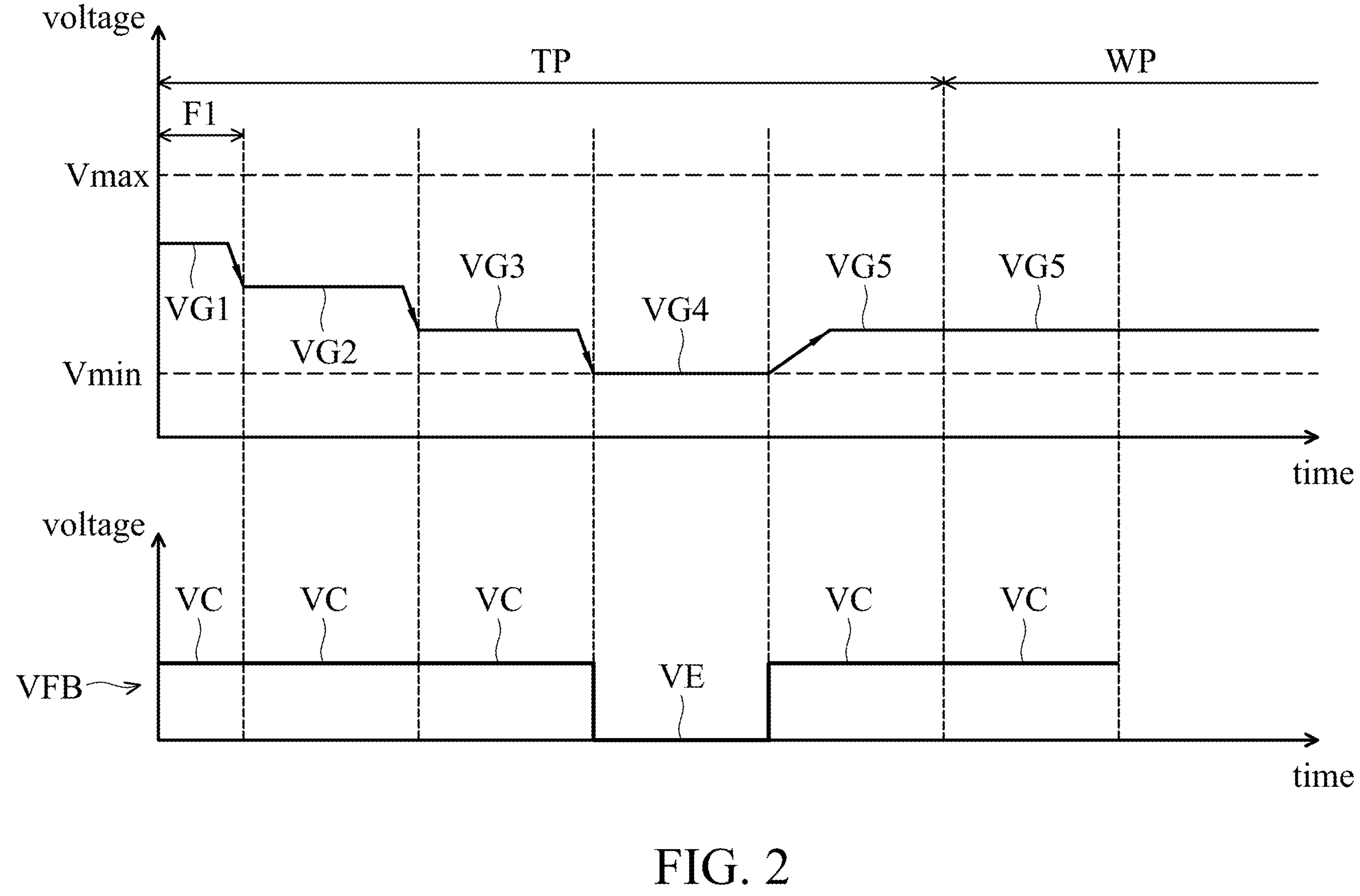
FIG. 2 is a timing diagram of a plurality of gate testing voltages and a feedback signal according to an embodiment of the disclosure.

FIG. 1 is a schematic view of an electronic device according to an embodiment of the disclosure. FIG. 2 is a timing diagram of a plurality of gate testing voltages and a feedback signal according to an embodiment of the disclosure. Please refer to FIG. 1 and FIG. 2. The electronic device 100 may at least include a display panel 110 and a control circuit 120.

The control circuit 120 may be electrically connected to the display panel 110. In some embodiments, the control circuit 120 may be a timing controller (T-CON), but the disclosure is not limited thereto.

In some embodiments, the display panel 110 may include a panel 111, a driving unit 112 and a driving unit 113. The panel 111 may be electrically connected to the driving unit 112 and the driving unit 113. The driving unit 112 may be electrically connected to the control circuit 120. The driving unit 112 may receive the gate testing signals VG1~VG5 provided by the control circuit 120 and drive the panel 110. In addition, the driving unit 112 may generate the corresponding feedback signal VFB to the control circuit 120 according to the driving result.

The driving unit 113 may be electrically connected to the control circuit 120. The driving unit 113 may receive the image signal IS provided by the control circuit 120 and drive the panel 111, so that the panel 111 may display an image frame corresponding to the image signal IS. In some embodiments, the panel 111 may be a non-self-luminous panel such as a liquid crystal display (LCD) panel, but the disclosure is not limited thereto. In other embodiments, the panel 111 may be a self-luminous panel, for example, a display panel including a display media such as an organic light emitting diode (OLED), a mini LED, a micro LED or a quantum dot LED, etc., but the disclosure is not limited thereto. In some embodiments, the driving unit 112 may be a gate driver, and the driving unit 113 may be a data driver, but the disclosure is not limited thereto.

As shown in FIG. 2, an operation period of the display panel 110 may include a detection period TP and a working period WP. In the embodiment, the detection period TP may be earlier than the working period WP. During the detection period TP, the control circuit 120 may provide the gate testing voltages VG1~VG5 to the display panel 110. In the embodiments, the above gate testing voltages VG1~VG5 may at least include a maximum testing voltage, an operation voltage and a failure testing voltage. In addition, after the driving unit 112 receives the gate testing voltages VG1~VG5, the driving unit 112 may drive according to the gate testing voltages, and generate the corresponding feedback signal VFB according to the driving result.

In the embodiment, during the detection period TP, the control circuit 120 gradually reduces the gate testing voltage until the gate testing voltage is equal to the failure testing voltage (such as the gate testing voltage VG4). Then, after detecting a failure (for example, receiving a failure signal VE), the control circuit 120 increases the gate testing voltage instead, and uses the minimum gate testing voltage (such as the gate testing voltage VG3) when the failure signal VE is not received as the operation voltage (such as the gate testing voltage VG5). Therefore, the voltage values of the gate testing voltage VG3 and the gate testing voltage VG5 are equal, and the control circuit 120 uses the above voltage value as the operation voltage.

More specifically, during the detection period TP, the control circuit 120 may provide the image signal IS that generates a black frame. On the one hand, it may test whether each gate in the panel 111 may be turned on during the process of lowering the gate testing voltage, so that each pixel in the panel 111 may receive the image signal IS. On the one hand, it also makes it difficult for the user to notice that the electronic device 100 is being tested. When each gate in the panel 111 may be turned on normally, the feedback signal VFB of the driving unit 112 is a correct signal VC. When the gate testing voltage is too low (for example, the gate testing voltage VG4), the gate in the panel 111 may not be turned on, causing an abnormality. At this time, the feedback signal VFB of the driving unit 112 is a failure signal VE, and the control circuit 120 increases the gate testing voltage instead after the control circuit 120 receives the failure signal VE. When the feedback signal VFB of the driving unit 112 returns to the correct signal VC, the gate testing voltage at this time (for example, the gate testing voltage VG5) is set to the operation voltage, and the gate driving voltage test during the detection period TP is completed. In the embodiment, the failure signal VE may be, for example, a low voltage level, and the correct signal VC may be, for example, a high voltage level, but the disclosure is not limited thereto.

It should be noted that the number of gate testing voltages in the disclosure is not limited to 5. In addition, the operation voltage may be defined as the minimum gate driving voltage among the driving voltages provided by the control circuit 120 that may enable the electronic device 100 to operate normally.

Furthermore, the maximum testing voltage may be higher than the operation voltage (for example, the gate testing voltage VG1 is higher than the gate testing voltage VG5), and the operation voltage may be higher than the failure testing voltage (for example, the gate testing voltage VG5 is higher than the gate testing voltage VG4), but the disclosure is not limited thereto. In addition, the gate testing voltage VG1 may be higher than the gate testing voltage VG2, the gate testing voltage VG2 may be higher than the gate testing voltage VG3, and the gate testing voltage VG3 may be higher than the gate testing voltage VG4. That is, in the embodiment, the voltage values of the gate testing voltages VG1~VG4 start to decrease from the maximum testing voltage (such as the gate testing voltage VG1).

Furthermore, the time point at which the maximum testing voltage appears may be earlier than the time point at which the failure testing voltage appears (for example, the time point that the gate testing voltage VG1 is earlier than the time point that the gate testing voltage VG4).

In some embodiments, the above gate testing voltages VG1~VG5 may be between the maximum voltage Vmax and the minimum voltage Vmin of the operating range of the driving unit 112. In addition, the gate testing voltage VG1 (such as the maximum testing voltage) may be lower than or equal to the maximum voltage Vmax (for example, the voltage value the gate testing voltage VG1 (such as the maximum testing voltage) is close to the voltage value of the maximum voltage Vmax), and the gate testing voltage VG4 (such as the failure testing voltage) may be higher than or equal to the minimum voltage Vmin (for example, the voltage value of the gate testing voltage VG4 (such as the failure testing voltage) is close to the voltage value of the minimum voltage Vmin).

As mentioned above, the number of operation voltage may be two (i.e., the operation voltage may appear twice), and the time point at which the failure testing voltage appears may be between the time points at which the two operation voltages appear. That is, the operation voltages may be the gate testing voltage VG3 and the gate testing voltage VG5, and the time point that the failure testing voltage (such as the gate testing voltage VG4) may be between the time points at which the two operation voltages (such as the gate testing voltage VG3 and the gate testing voltage VG5) appear.

In some embodiments, in the above gate testing voltages VG1~VG5, the maximum testing voltage may be the first testing voltage (i.e., the gate testing voltage VG1), and the operation voltage may be the last testing voltage (i.e., the gate testing voltage VG5).

According to the above mechanism, the gate driving voltage and the power consumption required by the electronic device 100 when displaying the frame may be appropriately reduced, and therefore the lifespan of the driving unit 112 may be extended.

In some embodiments, the maintenance time of each of the above gate testing voltages VG1~VG5 may be longer than or equal to a frame time, but the disclosure is not limited thereto. For example, as shown in FIG. 2, the maintenance time of the gate testing voltage VG1 may be equal to a frame time F1, and the maintenance times of the gate testing voltages VG2~VG5 may be longer than a frame time F1, but the disclosure is not limited thereto.

As shown in FIG. 1, the control circuit 120 may include a first lookup table 121 corresponding to a first reference voltage VT1 and a second lookup table 122 corresponding to a second reference voltage VT2. In the embodiment, the first reference voltage VT1 is lower than the second reference voltage VT2.

After completing the gate driving voltage test during the detection period TP, during the working period WP, the control circuit 120 may compare the operation voltage (such as the gate testing voltage VG5) with the first reference voltage VT1 and the second reference voltage VT2. When the control circuit 120 determines that the operation voltage (such as the gate testing voltage VG5) is lower than or equal to the first reference voltage VT1, the control circuit 120 may select the first lookup table 121 corresponding to the first reference voltage VT1. It should be noted that the content included in the first lookup table 121 is the parameter value corresponding to each gray level used to maintain the gamma value at a specific value when the operation voltage is equal to the first reference voltage VT1. In the same way, the content included in the second lookup table 122 is the parameter value corresponding to each gray level used to maintain the gamma value at a specific value when the operation voltage is equal to the second reference voltage VT2.

Then, the control circuit 120 may generate at least one image signal IS to the display panel 110 (for example, transmitting to the driving unit 113 of the display panel 110) according to the parameter value of the first lookup table 121, so that the display panel 110 displays according to the display signal IS (for example, the driving unit 113 drives the panel 111 to display according to the image signal IS).

In addition, when the control circuit 120 determines that the operation voltage (such as the gate testing voltage VG5) is higher than or equal to the second reference voltage VT2, the control circuit 120 may select the second lookup table 122 corresponding to the second reference voltage VT2. Then, the control circuit 120 may generate at least one image signal IS to the display panel 110 according to the parameter value of the second lookup table 122, so that the display panel 110 displays according to the image signal IS.

Furthermore, when the control circuit 120 determines that the operation voltage (such as the gate testing voltage VG5) is higher than the first reference voltage VT1 and lower than the second reference voltage VT2, the control module 120 may calculate the parameter values in the first lookup table 121 and the second lookup table 122 using an interpolation method, so as to generate an adjusted parameter value.

Then, the control circuit 120 may generate at least one image signal IS to the display panel 110 according to the adjusted parameter value, so that the display panel 110 displays according to the image signal IS. Therefore, by using different parameter values corresponding to different operation voltages, the gamma value when displaying images may be kept as consistent as possible, so that the optical quality of the electronic device 100 may be made consistent, or the display quality of the display device may be increased.

In the foregoing embodiments, the number of lookup tables is two (i.e., the first lookup table 121 and the second lookup table 122), but the disclosure is not limited thereto. In some embodiments, the number of lookup tables may be three or more. In cases where there are three lookup tables, the control circuit 120 may include a first lookup table 121 corresponding to a first reference voltage VT1, a second lookup table 122 corresponding to a second reference voltage VT2 and a third lookup table corresponding to a third reference voltage (not shown). In the embodiment, the first reference voltage VT1 is lower than the second reference voltage VT2, and the second reference voltage VT2 is lower than the third reference voltage VT3.

Similar to the embodiment with two lookup tables, when the operation voltage is lower than the first reference voltage VT1, the control circuit 120 may select the first lookup table 121 corresponding to the first reference voltage VT1 to generate the parameter value. When the operation voltage is higher than or equal to the third reference voltage VT3, the control circuit 120 may select the third lookup table corresponding to the third reference voltage VT3 to generate the parameter value. When the operation voltage is higher than the first reference voltage VT1 and lower than the second reference voltage VT2, the control circuit 120 may calculate the parameter values in the first lookup table 121 and the second lookup table 122 using an interpolation method, so as to generate an adjusted parameter value. When the operation voltage is higher than the second reference voltage VT2 and lower than the third reference voltage VT3, the control circuit 120 may calculate the parameters in the second lookup table 122 and the third lookup table using an interpolation method, so as to generate an adjusted parameter. Then, the control circuit 120 may generate at least one image signal IS to the display panel 110 according to the parameter value, so that the display panel 110 displays according to the image signal IS. In the above case, there are three lookup tables, but the operation method is analogous when there are four or more lookup tables. In addition, it should be noted that the driving unit 112 may still generate a feedback signal VFB during the working period WP, and during normal display, the feedback signal VFB is the correct signal VC. Moreover, during the detection period TP, the control circuit 120 provides the image signal IS that generates the black frame, which is independent of each of the lookup tables.

Figure 3:
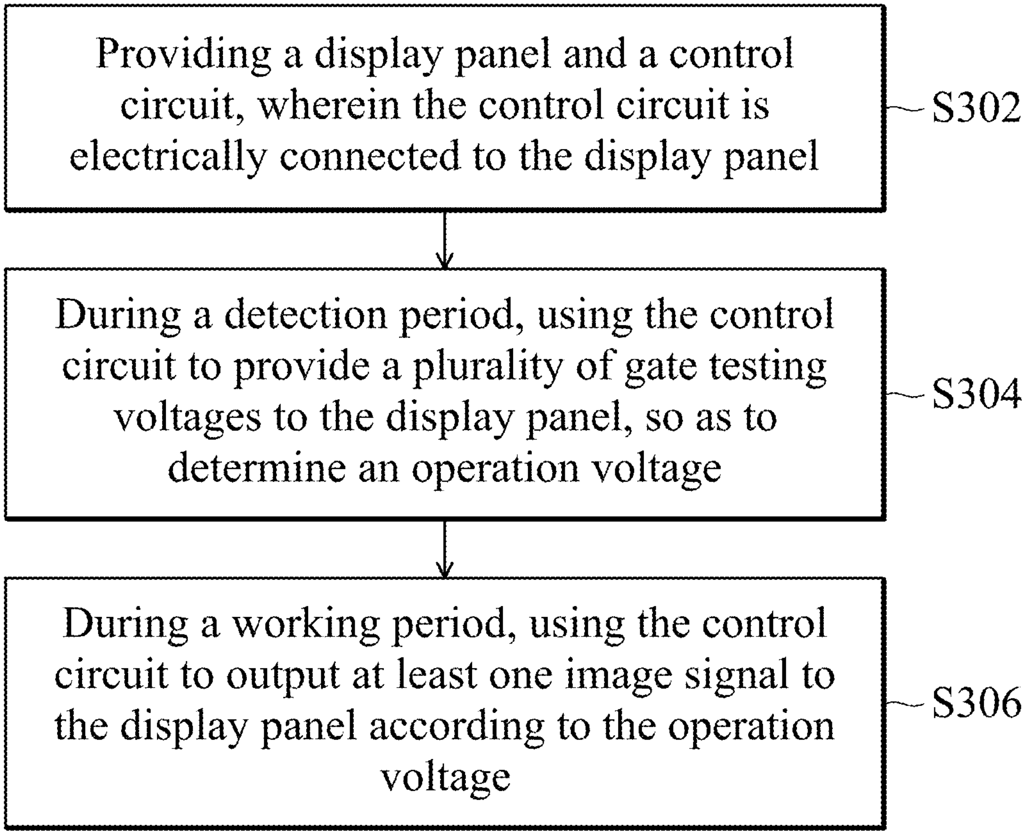
FIG. 3 is a flowchart of a method for displaying an image according to an embodiment of the disclosure.

FIG. 3 is a flowchart of a method for displaying an image according to an embodiment of the disclosure. Please refer to FIG. 3. In step S302, the method involves providing a display panel and a control circuit, wherein the control circuit is electrically connected to the display panel.

In step S304, the method involves during a detection period, using the control circuit to provide a plurality of gate testing voltages to the display panel, so as to determine an operation voltage. In the embodiments, the control circuit 120 starts from the maximum testing voltage and gradually reduces the gate testing voltage until the gate testing voltage is equal to the failure testing voltage. Then, after detecting a failure (for example, receiving a failure signal VE), the control circuit 120 increases the gate testing voltage instead, and uses the minimum gate testing voltage when the failure signal VE is not received as the operation voltage. Therefore, the gate testing voltage may include the maximum testing voltage, the operation voltage and failure testing voltage, the maximum testing voltage is higher than the operation voltage, the operation voltage is higher than the failure testing voltage, and the time point at which the maximum testing voltage appears is earlier than the time point at which the failure testing voltage appears.

In some embodiments, the above operation voltage appears twice, for example, and the time point at which the failure testing voltage appears is, for example, between the time points at which the two operation voltages appear. In some embodiments, in the above gate testing voltages, the maximum testing voltage is, for example, the first testing voltage, and the operation voltage is, for example, the last testing voltage. In some embodiments, after the control circuit provides the failure testing voltage, the control circuit may receive a failure signal. In some embodiments, the maintenance time of each of the gate testing voltages is longer than or equal to a frame time.

In step S306, the method involves during a working period, using the control circuit to output at least one image signal to the display panel according to the operation voltage.

The control circuit may include a first lookup table and a second lookup table, wherein a first reference voltage is, for example, lower than a second reference voltage, the first lookup table corresponds to, for example, the first reference voltage, and the second lookup table corresponds to, for example, the second reference voltage.

During the working period, when the operation voltage is lower than or equal to the first reference voltage, the control circuit may generate the at least one image signal according to a parameter value of the first lookup table. In some embodiments, when the operation voltage is higher than or equal to the second reference voltage, the control circuit may generate the at least one image signal according to a parameter value of the second lookup table.

In some embodiments, when the operation voltage is higher than the first reference voltage and lower than the second reference voltage, the control circuit may generate a parameter value using an interpolation method, and may generate at least one image signal according to the parameter value In summary, according to the method for display the image and the electronic device disclosed by the embodiments of the disclosure, during the detection period, the control circuit provides the gate testing voltages to the display panel, wherein the gate testing voltages include the maximum testing voltage, the operation voltage and the failure testing voltage, the maximum testing voltage is higher than the operation voltage, the operation voltage is higher than the failure testing voltage, and the time point that the maximum testing voltage appears is earlier than the time point that the failure testing voltage appears. During the working period, the control circuit outputs at least one image signal to the display panel according to the operation voltage. Therefore, the gamma values corresponding to different operation voltages may be kept consistent, so that the optical quality of the electronic device may be made consistent, or the lifespan of the driving unit may be extended, or the display quality of the display device may be increased.

While the disclosure has been described by way of examples and in terms of the preferred embodiments, it should be understood that the disclosure is not limited to the disclosed embodiments. On the contrary, it is intended to cover various modifications, combinations, and similar arrangements (as would be apparent to those skilled in the art). Therefore, the scope of the appended claims should be accorded the broadest interpretation to encompass all such modifications, combinations, and similar arrangements.

What is claimed is:

1. A method for displaying an image, comprising:

providing a display panel and a control circuit, wherein the control circuit is electrically connected to the display panel;

during a detection period, using the control circuit to provide a plurality of gate testing voltages to the display panel, wherein the plurality of gate testing voltages comprise a maximum testing voltage, an operation voltage and a failure testing voltage, the maximum testing voltage is higher than the operation voltage, the operation voltage is higher than the failure testing voltage, and a time point at which the maximum testing voltage appears is earlier than a time point at which the failure testing voltage appears;

during a working period, using the control circuit to output at least one image signal to the display panel according to the operation voltage;

wherein the operation voltage is a minimum gate driving voltage that a gate in the display panel is turned on normally, and the failure testing voltage is a voltage that the gate in the display panel is not turned on.

2. The method for displaying the image according to claim 1, wherein a number of the operation voltage is two, and a time point at which the failure testing voltage appears is between time points at which the two operation voltages appear.

3. The method for displaying the image according to claim 1, wherein in the plurality of gate testing voltages, the maximum testing voltage is a first testing voltage, and the operation voltage is a last testing voltage.

4. The method for displaying the image according to claim 1, wherein the control circuit comprises a first lookup table and a second lookup table, wherein the first lookup table corresponds to a first reference voltage, the second lookup table corresponds to a second reference voltage, and the first reference voltage is lower than the second reference voltage.

5. The method for displaying the image according to claim 4, wherein during the working period, when the operation voltage is lower than or equal to the first reference voltage, the control circuit is used to generate the at least one image signal according to a parameter value of the first lookup table.

6. The method for displaying the image according to claim 4, wherein when the operation voltage is higher than or equal to the second reference voltage, the control circuit is used to generate the at least one image signal according to a parameter value of the second lookup table.

7. The method for displaying the image according to claim 4, wherein when the operation voltage is higher than the first reference voltage and lower than the second reference voltage, the control circuit is used to generate a parameter value using an interpolation method, and to generate at least one image signal according to the parameter value.

8. The method for displaying the image according to claim 1, wherein after the control circuit provides the failure testing voltage, the control circuit is used to receive a failure signal.

9. The method for displaying the image according to claim 1, wherein a maintenance time of each of the plurality of gate testing voltages is longer than or equal to a frame time.

10. The method for displaying the image according to claim 1, wherein during the detection period, the control unit is used to provide the image signal that generates a black frame.

11. An electronic device, comprising:

a display panel; and a control circuit, electrically connected to the display panel;

wherein an operation period of the display panel comprises a detection period and a working period, during the detection period, the control circuit is configured to provide a plurality of gate testing voltages to the display panel, wherein the plurality of gate testing voltages comprise a maximum testing voltage, an operation voltage and a failure testing voltage, the maximum testing voltage is higher than the operation voltage, the operation voltage is higher than the failure testing voltage, and a time point at which the maximum testing voltage appears is earlier than a time point at which the failure testing voltage appears, and during the working period, the control circuit is configured to output at least one image signal to the display panel according to the operation voltage;

wherein the operation voltage is a minimum gate driving voltage that a gate in the display panel is turned on normally, and the failure testing voltage is a voltage that the gate in the display panel is not turned on.

12. The electronic device according to claim 11, wherein a number of the operation voltage is two, and a time point at which the failure testing voltage appears is between time points at which the two operation voltages appear.

13. The electronic device according to claim 11, wherein in the plurality of gate testing voltages, the maximum testing voltage is a first testing voltage, and the operation voltage is a last testing voltage.

14. The electronic device according to claim 11, wherein the control circuit comprises a first lookup table and a second lookup table, wherein the first lookup table corresponds to a first reference voltage, the second lookup table corresponds to a second reference voltage, and the first reference voltage is lower than the second reference voltage.

15. The electronic device according to claim 14, wherein during the working period, when the operation voltage is lower than or equal to the first reference voltage, the control circuit is configured to generate the at least one image signal according to a parameter value of the first lookup table.

16. The electronic device according to claim 14, wherein when the operation voltage is higher than or equal to the second reference voltage, the control circuit is configured to generate the at least one image signal according to a parameter value of the second lookup table.

17. The electronic device according to claim 14, wherein when the operation voltage is higher than the first reference voltage and lower than the second reference voltage, the control circuit is configured to generate a parameter value using an interpolation method, and to generate at least one image signal according to the parameter value.

18. The electronic device according to claim 11, wherein after the control circuit provides the failure testing voltage, the control circuit is configured to receive a failure signal.

19. The electronic device according to claim 11, wherein a maintenance time of each of the plurality of gate testing voltages is longer than or equal to a frame time.

20. The electronic device according to claim 11, wherein during the detection period, the control unit is configured to provide the image signal that generates a black frame.

* * * * *